US008410824B2

United States Patent
Mehdizad Taleie et al.

(10) Patent No.: US 8,410,824 B2
(45) Date of Patent: Apr. 2, 2013

(54) BUFFER WITH ACTIVE OUTPUT IMPEDANCE MATCHING

(75) Inventors: Shahin Mehdizad Taleie, San Diego, CA (US); Jan Paul van der Wagt, Carlsbad, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 59 days.

(21) Appl. No.: 12/604,186

(22) Filed: Oct. 22, 2009

(65) Prior Publication Data

US 2010/0295581 A1 Nov. 25, 2010

Related U.S. Application Data

(60) Provisional application No. 61/180,422, filed on May 21, 2009.

(51) Int. Cl.
*H03K 3/00* (2006.01)

(52) U.S. Cl. ...................................................... 327/108

(58) Field of Classification Search .................... None
See application file for complete search history.

(56) References Cited

U.S. PATENT DOCUMENTS

| 4,798,982 | A | | 1/1989 | Voorman |
| 5,121,080 | A | | 6/1992 | Scott, III et al. |
| 5,510,751 | A | | 4/1996 | Nauta |
| 5,585,763 | A | | 12/1996 | Navabi et al. |
| 5,719,529 | A | * | 2/1998 | Kawahara et al. ............ 330/253 |
| 6,229,396 | B1 | | 5/2001 | Zabroda |
| 7,038,501 | B2 | * | 5/2006 | Lee et al. ...................... 327/108 |
| 7,764,210 | B2 | * | 7/2010 | Rentala et al. ................ 341/144 |
| 2004/0201416 | A1 | | 10/2004 | Wyers et al. |
| 2007/0052454 | A1 | | 3/2007 | Gose et al. |
| 2007/0273413 | A1 | * | 11/2007 | Kibune ......................... 327/108 |

FOREIGN PATENT DOCUMENTS

| DE | 102008022950 | 12/2008 |
| EP | 1168740 | 1/2002 |

OTHER PUBLICATIONS

International Search Report and Written Opinion—PCT/US2010/035862, International Search Authority—European Patent Office—Oct. 5, 2010.
Nauta, B.; Dijkstra, M.B. "Analog line driver with adaptive impedance matching", Solid-State Circuits, IEEE Journal of vol. 33 , Issue: 12, Digital Object Identifier: 10.1109/4.735540 Dec. 1998, pp. 1992-1998.

* cited by examiner

*Primary Examiner* — Lincoln Donovan
*Assistant Examiner* — Khareem E Almo
(74) *Attorney, Agent, or Firm* — Ramin Mobarhan

(57) ABSTRACT

Techniques for designing a buffer capable of working with low supply voltages, and having active output impedance matching capability to optimize power delivery to a wide range of loads. In an exemplary embodiment, cascode transistors are provided in a buffer architecture employing common-source transistors having unequal width-to-length ratios (W/L) and a resistance having a corresponding fixed ratio to the load. At least one of the cascode transistors may be dynamically biased to minimize a difference between the drain voltages of the common-source transistors. In a further exemplary embodiment, the output impedance of the buffer may be actively tuned by selectively enabling a set of tuning transistors coupled in parallel with the load. Further techniques for providing a calibration mode and an operation mode are described.

23 Claims, 9 Drawing Sheets

BUFFER WITH ACTIVE OUTPUT IMPEDANCE MATCHING

RELATED APPLICATIONS

This application claims priority to U.S. Provisional Pat. App. Ser. No. 61/180,422, entitled "Buffer with active impedance matching using foreground calibration for high linearity and accurate impedance control," filed May 21, 2009, the contents of which are hereby incorporated by reference herein in their entirety.

BACKGROUND

1. Field

The disclosure relates to electronic circuit design, and in particular, to the design of voltage buffers with active output impedance matching.

2. Background

In the art of electronic circuit design, buffers are provided to enable an input signal, e.g., an input voltage, to efficiently drive a load. Buffers may be used, e.g., as drivers for analog and digital applications such as video, audio, serial binary data, etc. The goals of buffer design include minimizing the power consumption of the buffer itself, as well as delivering power efficiently to the load by minimizing reflections from the load due to impedance mismatch. The design of buffers in sub-micron CMOS processes presents additional challenges, as the low supply voltages used may negatively impact the linearity and the impedance match between the buffer output and the load.

It would be desirable to provide techniques for designing buffers capable of working with low supply voltages commonly found in sub-micron CMOS processes, and further having active output impedance matching capability to optimize power delivery to a wide range of loads.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term "exemplary" used throughout this description means "serving as an example, instance, or illustration," and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well-known structures and devices are shown in block diagram form in order to avoid obscuring the novelty of the exemplary aspects presented herein.

Figure 1:
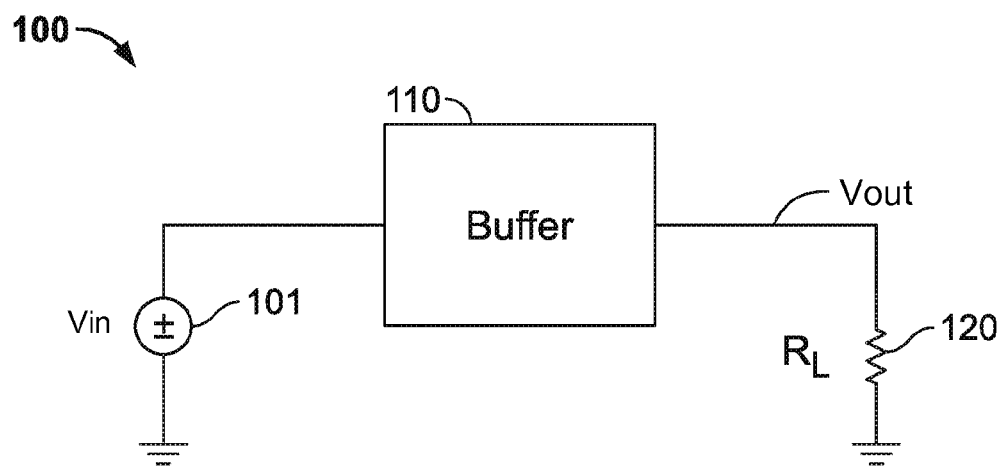
FIG. 1 illustrates an exemplary system employing a buffer.

FIG. 1 illustrates an exemplary system 100 employing a buffer 110. In FIG. 1, a voltage source 101 generates a signal voltage Vin to be delivered to a load 120 having an impedance $Z_L$. Note for simplicity, the load 120 may be denoted herein by only its real (resistive) portion $R_L$. One of ordinary skill in the art will appreciate that the discussion may be readily applied to a load 120 having imaginary as well as real portions, i.e., $Z_L$ may be complex.

In FIG. 1, Vin is coupled to a buffer 110 that buffers Vin and generates a voltage Vout related to Vin at the load 120. The buffer 110 is ideally designed to provide adequate current drive to the load 120 to support the voltage Vout, as well as to provide impedance matching to minimize reflections from the load 120.

Figure 2A:
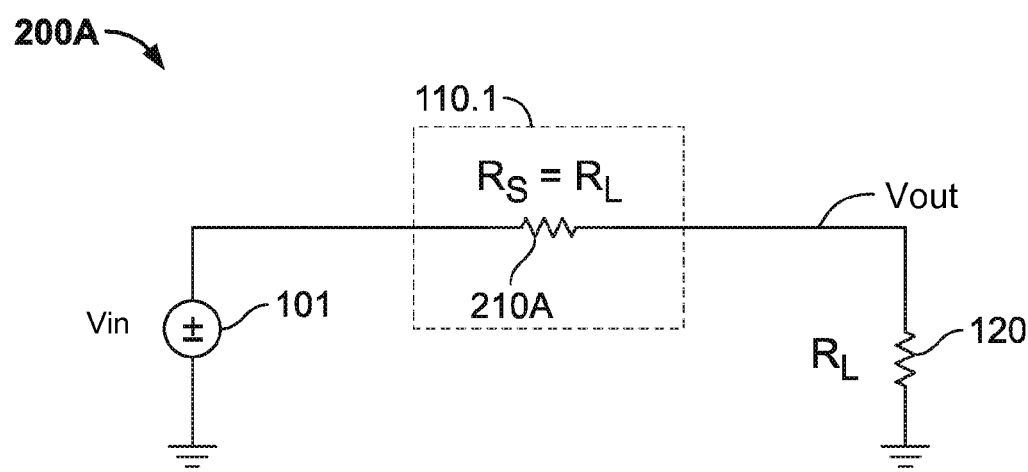
FIG. 2A illustrates a system including a prior art implementation of a buffer.

FIG. 2A illustrates a system 200A including a prior art implementation 110.1 of a buffer 110. The buffer 110.1 simply includes a series resistance 210A (or $R_S$) matched to the load 120 to minimize reflections from and optimize power transfer to the load 120. For example, the series resistance $R_S$ may be equal to the expected load resistance $R_L$. One of ordinary skill in the art will appreciate that a limitation of the buffer 110.1 is that, due to the resistive division of $R_S$ in series with $R_L$, half the input voltage Vin will be dropped across $R_S$. This undesirably wastes power, and further requires Vin to be at least twice the output voltage Vout, which is undesirable in low-voltage applications wherein voltage swing (or "headroom") is at a premium.

Figure 2B:
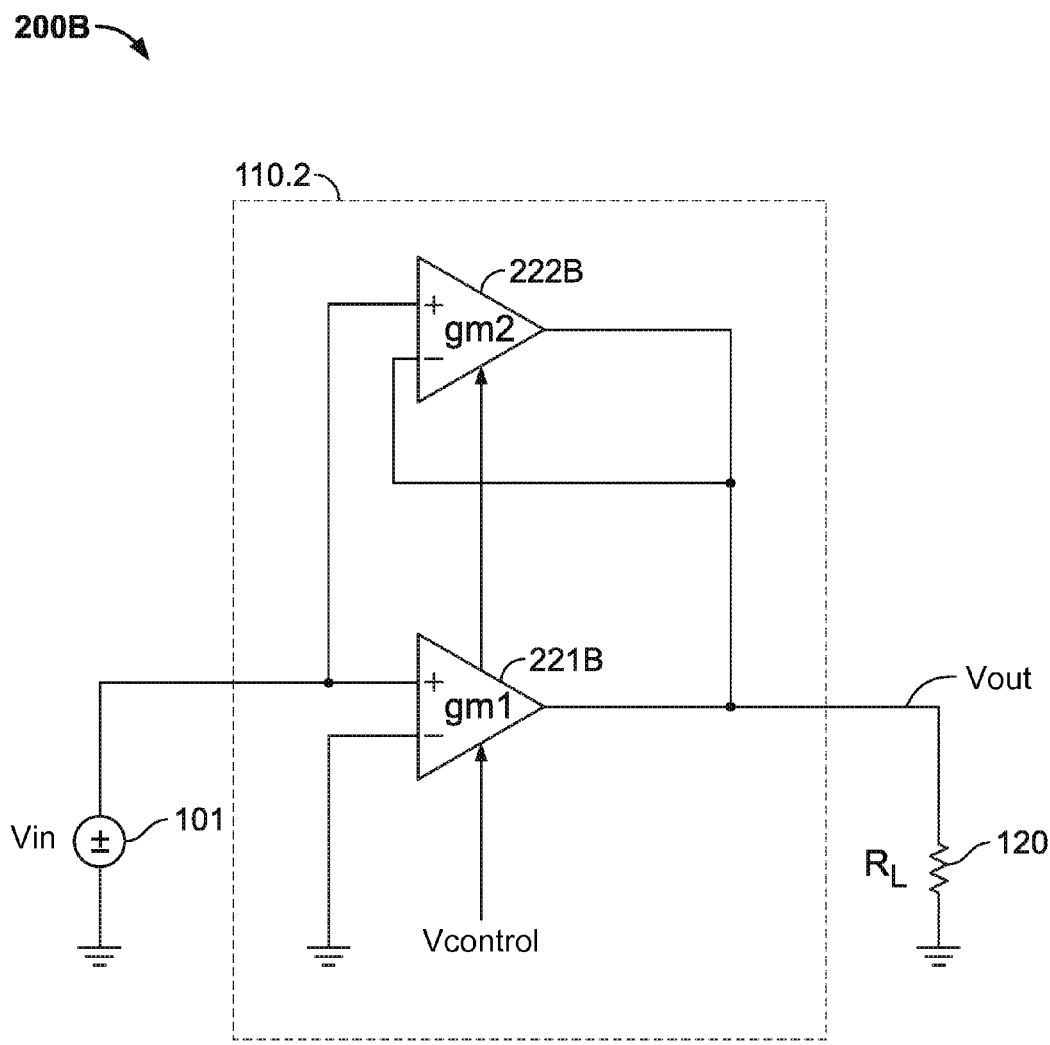
FIG. 2B illustrates a system including another prior art implementation of a buffer.

FIG. 2B illustrates a system 200B including another prior art implementation 110.2 of a buffer 110. Detailed description of the prior art buffer 110.2 and 110.3 (later discussed herein) may be found in, e.g., Nauta, et al., "Analog Line Driver with Adaptive Impedance Matching," IEEE Journal of Solid-State Circuits, pp 1992-1998 (December 1998). The buffer 110.2 includes a first transconductance amplifier 221B having transconductance gm1 and a second transconductance amplifier 222B having transconductance gm2. The values of gm1 and gm2 are controlled by a control voltage Vcontrol. The outputs of the first and second transconductance amplifiers 221B and 222B are coupled together to generate the output voltage Vout for the load 120.

One of ordinary skill in the art will appreciate that, by setting gm1 and gm2 equal to a common transconductance gm, the gain and output resistance Rout of the buffer 110.2 may be expressed as follows:

$$\text{gain (of 110.2)} = \frac{Vout}{Vin} = \frac{2gmR_L}{1+gmR_L}; \text{ and} \quad \text{(Eq. 1)}$$

$$Rout(\text{of 110.2}) = \frac{1}{gm}. \quad \text{(Eq. 2)}$$

Furthermore, if the control voltage Vcontrol is configured to set $$gm = \frac{1}{R_L},$$

then the gain is equal to 1, and Rout=$R_L$.

Figure 2C:
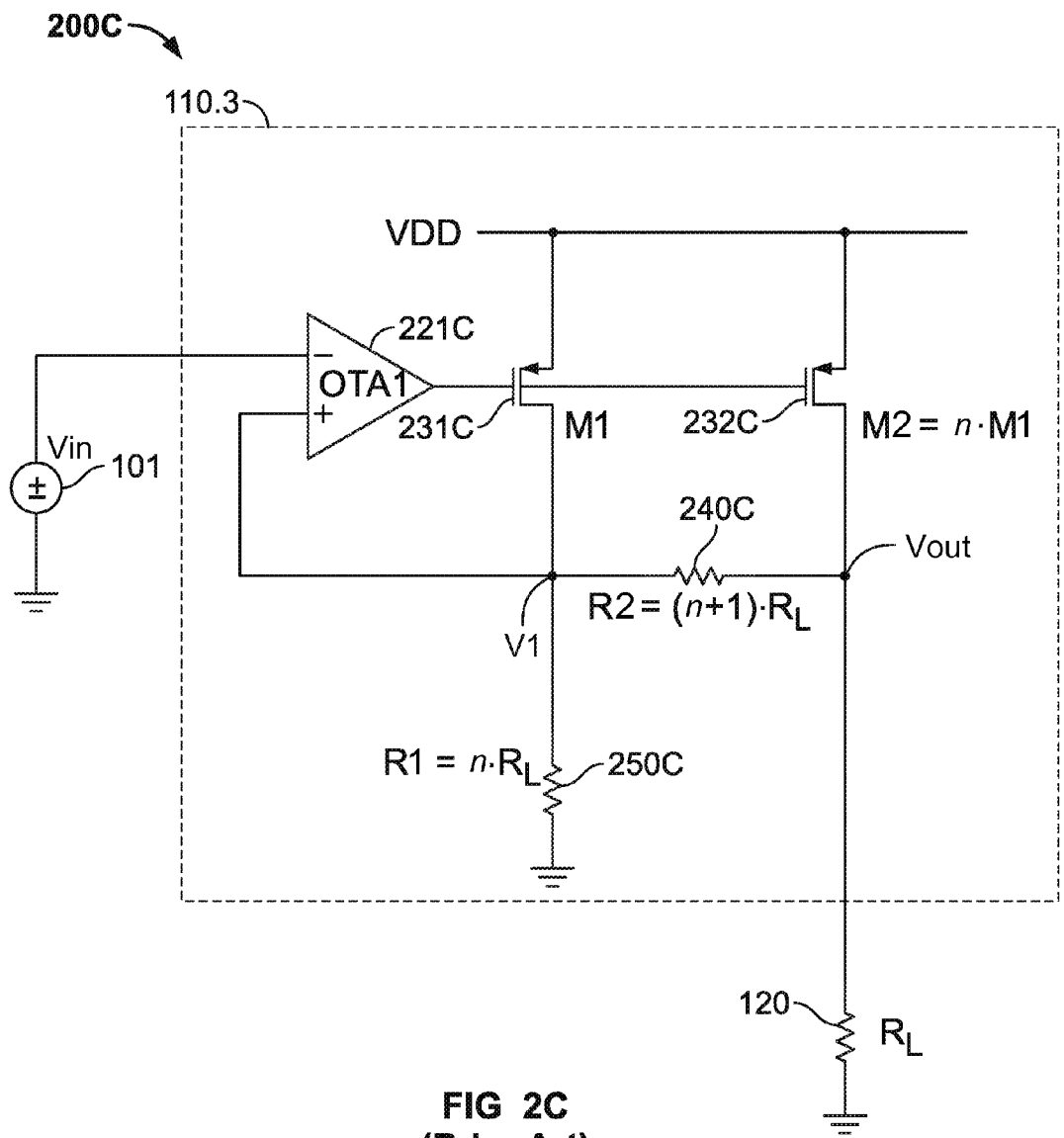
FIG. 2C illustrates a system including a prior art implementation of a buffer based on the buffer described in FIG. 2B.

Since it may be difficult to control the gm of a transconductance amplifier accurately over supply voltage and temperature variations, it may be preferable to have a system in which the output resistance is determined by the value of resistors, whose resistance may be relatively stable over such variations. FIG. 2C illustrates a system 200C including a prior art implementation 110.3 of a buffer 110 based on resistors.

In FIG. 2C, the buffer 110.3 includes a first operational transconductance amplifier 221C (or OTA1), and transistors 231C (or M1) and 232C (or M2). It will be appreciated that OTA1 ideally provides a high current gain to a voltage difference between its positive and negative input terminals. Note the negative input terminal of OTA1 is coupled to Vin, the positive input terminal of OTA1 is coupled to the drain of M1, and the output terminal of OTA1 is coupled to the gates of M1 and M2.

M2 is sized to have a width-over-length ratio (W/L) n times greater than the W/L of M1, wherein n is greater than 1. The drain of M2 is coupled via a resistor 240C having resistance R2=(n+1)·$R_L$, to the drain of M1, and the drain of M1 is further coupled to ground via a resistor 250C having resistance R1=n·$R_L$. The output voltage Vout is coupled to the drain of M2. It will be appreciated that due to the negative feedback applied around OTA1, the drain current of M1 is $$\frac{Vin}{n \cdot R_L},$$

and the drain current of M2 is correspondingly $$\frac{Vin}{R_L}.$$

Thus Vout will be equal to Vin, and the gain of the buffer 110.3 may be expressed as follows:

$$\text{gain (of 110.3)} = \frac{Vout}{Vin} = 1. \quad \text{(Eq. 3)}$$

To determine the output resistance Rout of the buffer 110.3, it will be appreciated that if the load resistance $R_L$, is replaced with a small-signal AC current i (not shown), then i would split between the drains of M1 and M2 according to their relative W/L, e.g., $$\frac{1}{1+n}i$$

would flow into the drain of M1, while $$\frac{n}{1+n}i$$

would flow into the drain of M2. Furthermore, $$\frac{1}{1+n}i$$

would flow through R2 from node Vout to node V1. Since V1 is constant (at Vin) due to negative feedback around OTA1, the small-signal change v in Vout due to i may be expressed as follows:

$$v = R2 \cdot \frac{1}{1+n}i; \quad \text{(Eq. 4a)}$$

$$= (n+1) \cdot R_L \cdot \frac{1}{1+n}i; \quad \text{(Eq. 4b)}$$

$$= R_L \cdot i; \text{ and} \quad \text{(Eq. 4c)}$$

$$\frac{v}{i} = R_L = Rout(\text{of 110.3}). \quad \text{(Eq. 4d)}$$

As seen from Eq. 4d, the output resistance Rout is made equal to the load resistance $R_L$ by appropriately choosing the resistances R1 and R2.

It will be appreciated that one limitation of the buffer 110.3 is that distortion may be introduced to Vout when lower supply voltages VDD are used, e.g., less than 2 Volts as typically found in sub-micron CMOS processes. It would be desirable to provide techniques for designing a buffer capable of working with lower supply voltages, and also whose output resistance may be dynamically configured depending on variations in the load, input/output voltage swing, and process corners.

Figure 3:
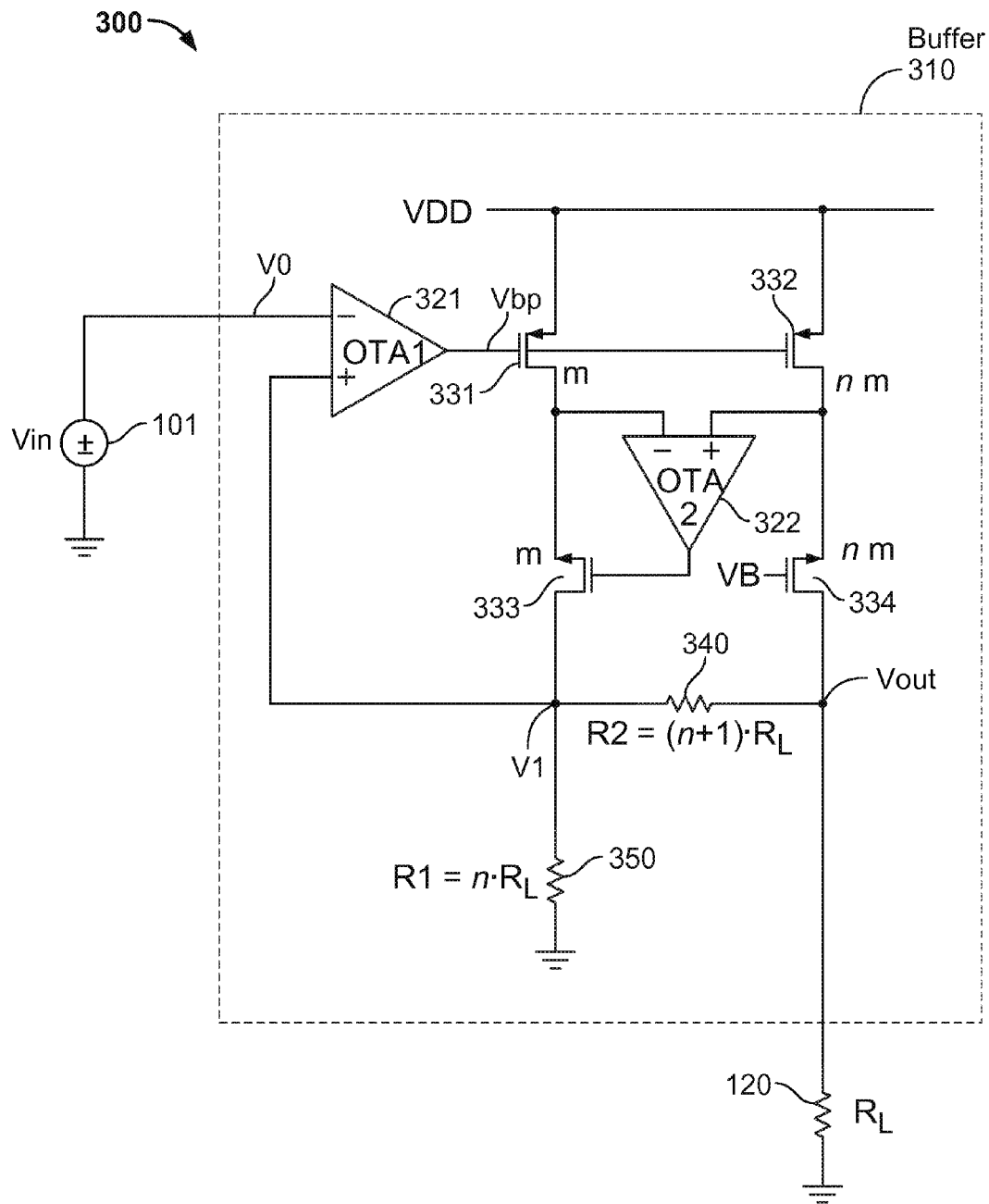
FIG. 3 illustrates a system including an exemplary embodiment of a buffer according to the present disclosure.

FIG. 3 illustrates a system 300 including an exemplary embodiment of a buffer 310 according to the present disclosure. The buffer 310 includes a first operational transconductance amplifier 321 (or OTA1), and first and second common-source transistors 331 and 332. Transistors 331 and 332 are further coupled to first and second cascode transistors 333 and 334, respectively. As indicated in FIG. 3, the W/L of transistor 332 may be n times the W/L=m of transistor 331, and the W/L of transistor 334 may also be n times the W/L=m of transistor 333. The negative input terminal of OTA1 (supporting a voltage V0) is coupled to Vin, the positive input terminal of OTA1 is coupled to the drain of transistor 333

(supporting a voltage V1), and the output terminal of OTA1 (supporting a voltage Vbp) is coupled to the gates of transistors 331 and 332.

In FIG. 3, the drain of transistor 334 is coupled via a resistor 340 having resistance $R2=(n+1)\cdot R_L$ to the drain of transistor 333, and the drain of transistor 333 is further coupled to ground via a resistor 350 having resistance $R1=n\cdot R_L$. It will be appreciated that in the exemplary embodiment shown, OTA1 adjusts the gate voltage of transistor 331 to minimize the difference between the drain voltage of transistor 333 and the input voltage Vin.

A second operational transconductance amplifier 322 (or OTA2) accepts the drain voltages of transistors 332 and 331 at its positive and negative terminals, respectively, and generates an output current coupled to the gate of transistor 333. The output voltage Vout is coupled to the drain of transistor 334. In an exemplary embodiment, OTA2 compares the drain voltages of transistors 331 and 332, and feeds back the amplified error to the gate of the cascode transistor 333. It will be appreciated that OTA2 is configured to minimize the difference between the drain voltages of transistors 331 and 332, thereby ensuring that the ratio of the current through transistors 332 and 334 versus the current through transistors 331 and 333 is close to n. This improves the ability of buffer 310 to match its output impedance to the load resistance $R_L$, such that it may cancel voltage waves reflected from the load due to imperfect impedance matching.

In the exemplary embodiment shown, the output of OTA2 is fed back to the gate of transistor 333, which has a W/L n times less than transistor 334. (Assuming L is constant, the gate capacitance would also be n times less.) The gate of transistor 334 may be correspondingly biased by a bias voltage VB. One of ordinary skill in the art will appreciate however that in alternative exemplary embodiments (not shown), the output of OTA2 may instead be fed back to the gate of transistor 334, and transistor 333 be provided with a constant bias voltage. Such alternative exemplary embodiments are contemplated to be within the scope of the present disclosure. It will be appreciated that in the exemplary embodiment shown, OTA2 adjusts the gate voltage of transistor 333 to minimize the difference between the drain voltages of transistors 331 and 332.

In alternative exemplary embodiments (not shown), it will be appreciated that the operational transconductance amplifiers 321 and 322 may be replaced with other types of high-gain amplifiers known in the art. For example, a high-gain operational voltage amplifier (i.e., op amp) may also be used. Such alternative exemplary embodiments are contemplated to be within the scope of the present disclosure.

Figure 4:
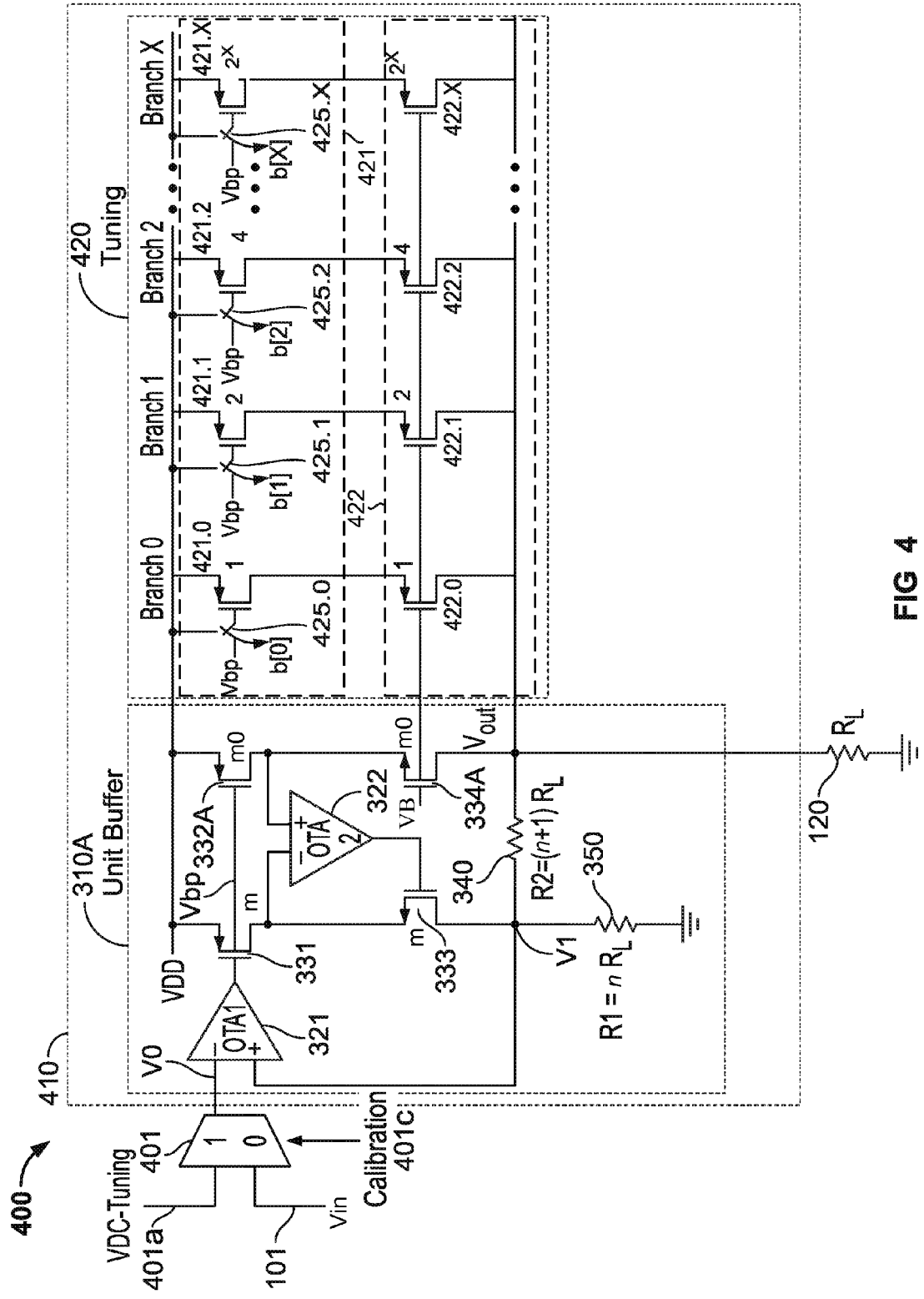
FIG. 4 illustrates a system including an exemplary embodiment of a buffer having a tuning module for matching the output impedance of the buffer to the load.

FIG. 4 illustrates a system 400 including an exemplary embodiment of a buffer 410 having a tuning module 420 for matching the output impedance of the buffer 410 to the load 120. In FIG. 4, the buffer 410 includes a unit buffer 310A designed according to the principles earlier described with reference to buffer 310 in FIG. 3, with the distinction that transistors 332A and 334A need not have a W/L that is n times the W/L=m of transistors 331 and 333. In an exemplary embodiment, transistors 332A and 334A have a W/L=m0=n0·m, wherein n0 is smaller than n. In an exemplary embodiment, both n and n0 may be much larger than 1, which is advantageous to the accuracy of the tuning scheme as will be described below, and further minimizes the power dissipated by transistors 331 and 333. A typical value of n may be, e.g., 40, although one of ordinary skill in the art will appreciate that the W/L of transistors 332 and 334 may generally be any multiple of m according to the present disclosure. Such alternative exemplary embodiments are contemplated to be within the scope of the present disclosure.

The buffer 410 further includes a tuning module 420. The tuning module 420 includes a plurality of branches labeled Branch 0 through Branch X. Each Branch x (wherein x denotes herein an index from 0 to X) includes a common-source transistor 421.x coupled to a corresponding cascode transistor 422.x. The output (i.e., the drain) of each cascode transistor 422.x is coupled to the drain of transistor 334A of unit buffer 310A. In the tuning module 420, the gate of each common-source transistor 421.x is selectively coupled by a switch 425.x to either the voltage Vbp generated by OTA1 to turn on the transistor 421.x, or to the source voltage VDD to turn off the transistor 421.x. The setting of the switch 425.x is controlled by a corresponding control signal b[x], with the entire set of control signals for Branch 0 through Branch X being denoted herein as b[0:X] for simplicity. The gate of each cascode transistor 422.x is coupled to the bias voltage VB used to bias transistor 334A of unit buffer 310A.

In an exemplary embodiment, the plurality of common-source transistors 421.0 through 421.X may be collectively denoted as a variable-size common-source transistor 421, and the plurality of cascode transistors 422.0 through 422.X may be collectively denoted as a variable-size cascode transistor 422. It will be appreciated that by selectively controlling whether each transistor 421.x is turned on or off using the control signals b[0:X], the effective W/L of the variable size transistors 421 and 422 may be selectively adjusted. As the effective W/L of transistors 421 and 422 relative to transistors 331 and 333 affects the output impedance of the buffer 410, as further described hereinbelow, adjusting the size of the variable-size transistors 421 and 422 may advantageously minimize any mismatch between the output impedance of the buffer 410 and the impedance of the load 120.

In an exemplary embodiment, the W/L of the transistors in the tuning module 420 may be binary-weighted by branch. For example, the W/L of transistors 421.0 and 422.0 in Branch 0 may be one unit, the W/L of transistors 421.1 and 422.1 in Branch 1 may be two units, the W/L of transistors 421.1 and 422.1 in Branch 1 may be four units, etc., up to the W/L of transistors 421.X and 422.X in Branch X being $2^X$ units. One of ordinary skill in the art will appreciate that alternative exemplary embodiments may employ alternative weighting schemes and control schemes (e.g., a thermometer code) for the transistors in the tuning module 420, and such alternative exemplary embodiments are contemplated to be within the scope of the present disclosure.

Figure 4A:
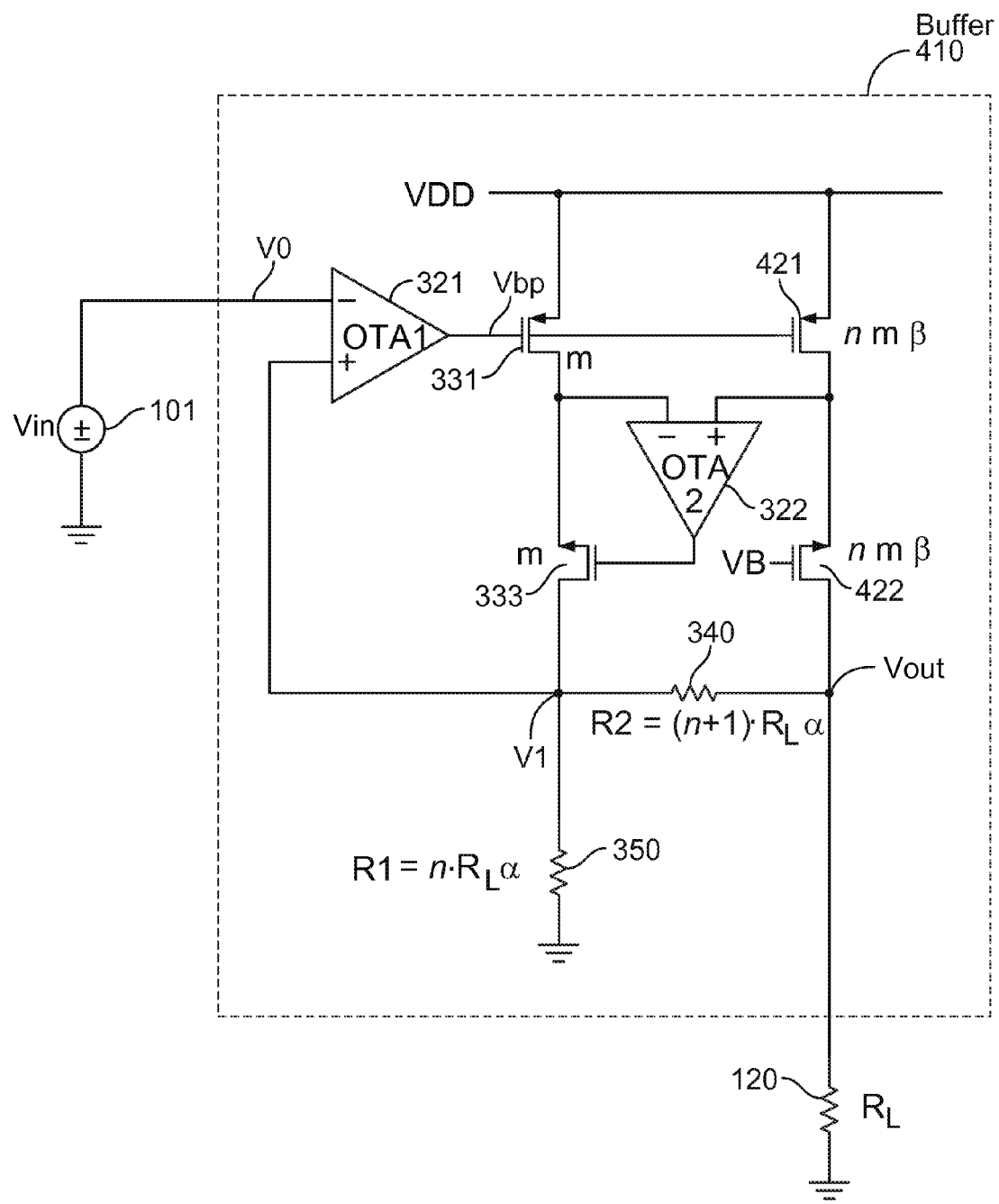
FIG. 4A illustrates the operation of the buffer with a variable-size common-source transistor and a variable-size cascode transistor.

FIG. 4A illustrates the operation of the buffer 410 with variable-size common-source transistor 421 and variable-size cascode transistor 422. In FIG. 4A, transistors 421 and 422 each have a variable W/L of $\beta \cdot n \cdot m$, wherein $\beta$ is a variable factor determined by the composite W/L of: 1) transistor 332A, and 2) those of the common-source transistors 421.0 through 421.X in the tuning module 420 that are switched on based on the configuration of the control signals b[0:X]. The relationship between $\beta$ and the control signals b[0:X] may be expressed as follows:

$$\beta \cdot n \cdot m = n0 \cdot m + b[0:X] = m0 + b[0:X]. \quad \text{(Eq. 5)}$$

It will be appreciated that if n0 is chosen to be smaller than n, and n0·m+max b[0:X] is chosen to be larger than n, then $\beta$ may be correspondingly varied from being smaller than 1 to being greater than 1 by appropriate choice of b[0:X].

In FIG. 4A, the resistances R1 and R2 are shown to include a multiplicative uncertainty factor $\alpha$. $\alpha$ may incorporate variance in the expected absolute values of resistances R1 and R2 due to, e.g., limited precision of manufacturing processes, and/or other factors. If α differs from 1 (e.g., a may typically range from 0.9 to 1.1), the on-chip values of resistances R1 and R2 will differ from their nominal values, and thus a buffer such as 410 with β set to 1 may exhibit inaccurate impedance matching and also gain inaccuracy. (One of ordinary skill in the art will appreciate that by, e.g., carefully matching the layout of resistors 340 and 350, the same factor α may be made to appear in both R1 and R2.)

One of ordinary skill in the art will appreciate that the gain and output resistance Rout of the buffer 410, accounting for α and β, may be expressed as follows:

$$\text{gain}(\alpha, \beta)(\text{of } 410) = \frac{Vout}{Vin} = \frac{1 + n\beta + (1+n)\beta}{1 + n\beta + (1+n)\alpha}; \text{ and} \quad (\text{Eq. 6})$$

$$Rout(\alpha, \beta)(\text{of } 410) = R_L \frac{(1+n)\alpha}{1+n\beta}. \quad (\text{Eq. 7})$$

From Eqs. 6 and 7, it will be appreciated that by adjusting the control signals b[0:X] to control β, both the gain and the output resistance of the buffer 410 may be controlled, thereby advantageously compensating for the effects of non-unity values of α on the gain and output resistance. From Eq. 6, it will be further appreciated that in the limiting case wherein the difference between V1 and Vout is made zero, and wherein Vout is thus equal to V1, then β may effectively be made equal to α. In this case, Eq. 7 may then be simplified as follows:

$$Rout(\alpha, \beta) = R_L \frac{1 + \frac{1}{n}}{1 + \frac{1}{\alpha n}}. \quad (\text{Eq. 8})$$

As n is assumed to be much larger than 1, and α is close to 1, Eq. 8 shows that Rout will be roughly equal to $R_L$. In light of the preceding, it will be appreciated that a calibration method that adjusts b[0:X] to equalize V1 and Vout may advantageously lead to both a controlled unity voltage gain for the buffer 410, as well as a controlled output resistance equal to $R_L$.

Figure 5:
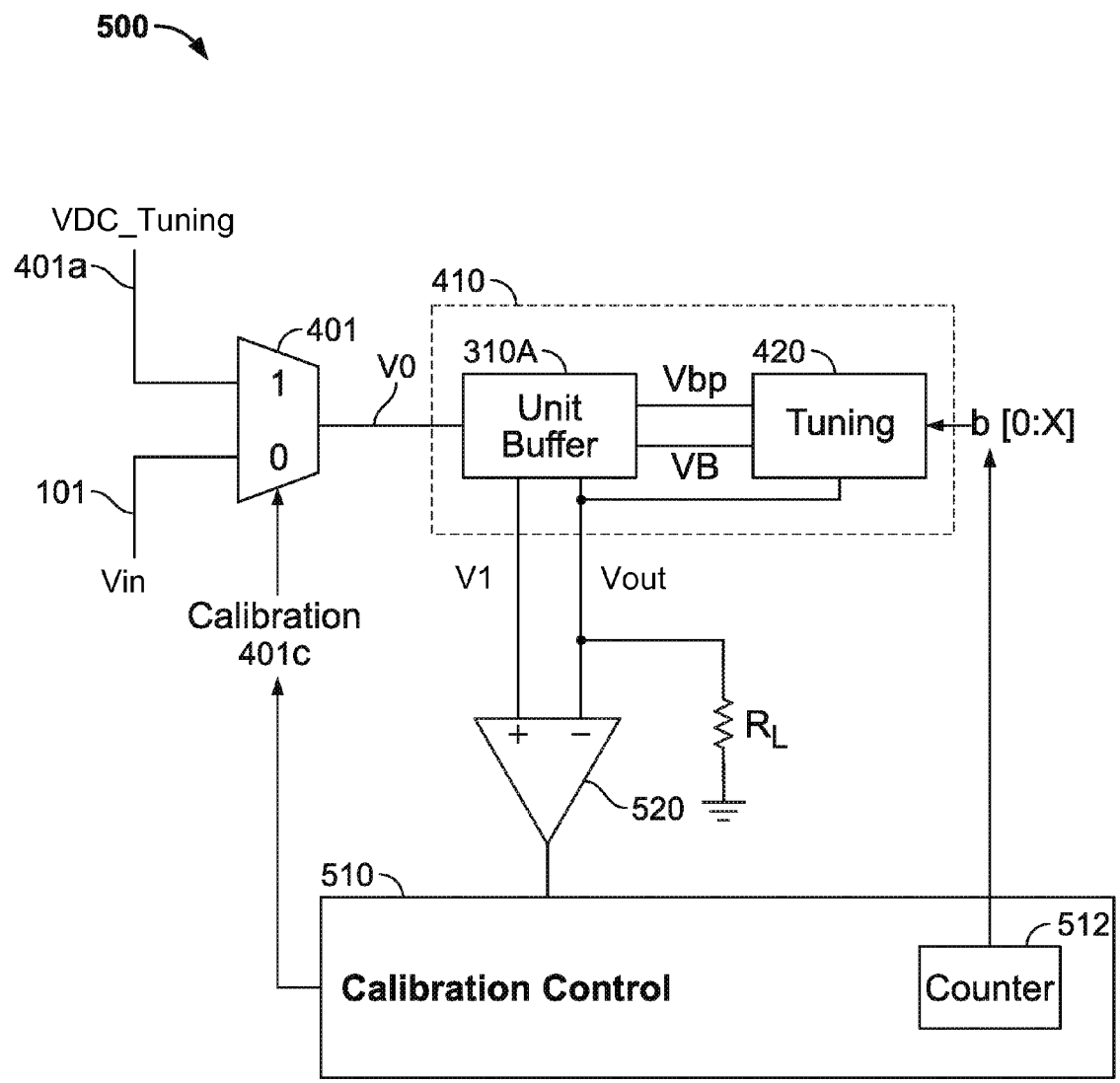
FIG. 5 illustrates an exemplary embodiment of a system for calibrating an output resistance of the buffer described in FIG. 4 to equalize V1 and Vout.

FIG. 5 illustrates an exemplary embodiment 500 of a system for calibrating the buffer 410 to equalize V1 and Vout. Note FIG. 5 is shown for illustrative purposes only, and one of ordinary skill in the art may readily derive alternative exemplary embodiments for calibrating the output resistance of the buffer 410 in light of the principles disclosed herein.

In FIG. 5, the system 500 includes a buffer 410, which in turn includes unit buffer 310A and a tuning module 420 as described with reference to FIG. 4. The input voltage V0 to OTA1 (not shown in FIG. 5) of unit buffer 310A is derived from a multiplexer (or mux) 401. The multiplexer 401 selects V0 from either the input voltage Vin or a DC tuning voltage VDC_Tuning 401a based on a calibration signal 401c. In the exemplary embodiment shown, the calibration signal 401c is generated by a calibration control module 510.

The calibration control module 510 may include a counter 512 configured to sweep the control signals b[0:X] through a suitable range of values. For example, in an exemplary embodiment wherein the W/L of the transistors in the tuning module 420 are binary-weighted, the control signals b[0:X] may be incrementally swept from a minimum value of b[0:X]=0 to a maximum value of b[0:X]=$2^{X+1}$−1 to determine an optimal W/L of the variable-size common-source transistor 421.

It will be appreciated that, if the DC tuning voltage VD_Tuning 401a is coupled to the buffer 410 during a calibration phase, then any voltage reflected from the load 120 back to the buffer 410 will appear as an offset between V1 and Vout. In the exemplary embodiment shown, an error amplifier 520 is configured to amplify the error between the voltages V1 and Vout, and to provide the amplified error back to the calibration control module 510. The calibration control module 510 may thus identify an optimum value b[0:X]* of the control signals b[0:X] corresponding to, e.g., a minimum difference between the voltages V1 and Vout, and apply such optimum value b[0:X]* to the tuning module 420 during normal operation of the buffer 410.

Figure 6:
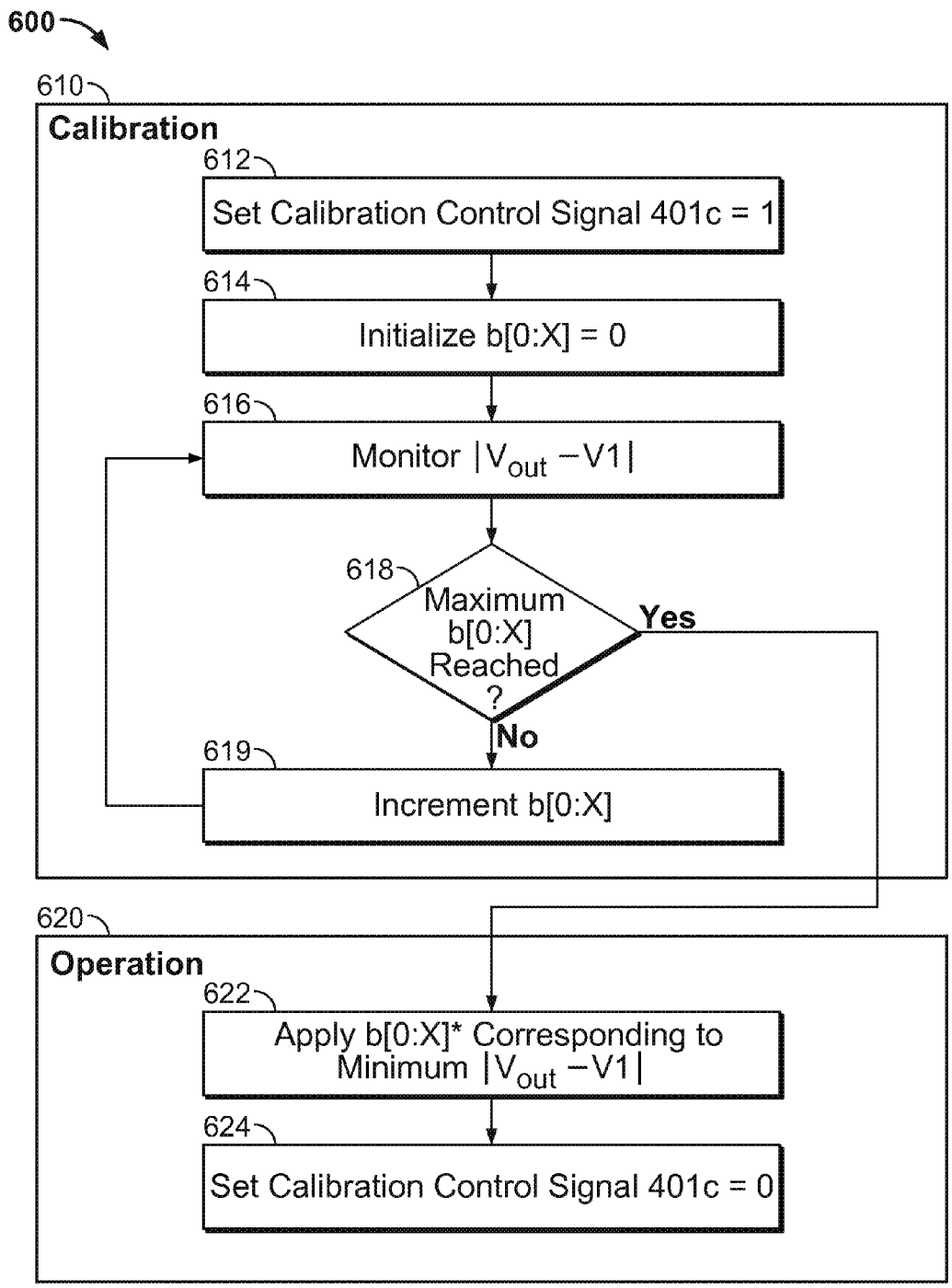
FIG. 6 illustrates an exemplary embodiment of a method of calibrating and operating the buffer shown in FIG. 5 according to the present disclosure.

FIG. 6 illustrates an exemplary method 600 of calibrating and operating the buffer 410 shown in FIG. 5 according to the present disclosure. Note the method 600 is shown for illustrative purposes only, and is not meant to limit the scope of the present disclosure to any particular method shown.

In FIG. 6, a calibration block 610 is coupled to an operation block 620. The calibration block 610 includes blocks 612, 614, 616, 618, and 619, while the operation block 620 includes blocks 622 and 624.

At block 612, the calibration control signal 401c is set to 1. It will be appreciated that this selects the input voltage V0 to unit buffer 310A to be the DC tuning voltage VDC_Tuning 401a. In an exemplary embodiment, VDC_Tuning 401a may be set at a reasonable value within the expected range of Vout during actual system operation. For example, VDC_Tuning 401a may be set at 1 Volt in a system wherein Vout ranges from 0 to 1.3 Volts, which corresponds to a typical range for video applications.

At block 614, the control signals b[0:X] are initialized. In the exemplary embodiment shown, b[0:X] may be initialized to a setting wherein each b[x] is zero, or b[0:X]=0.

At block 616, the absolute difference between Vout and V1 (denoted as |Vout−V1|) corresponding to each setting of b[0:X] is monitored. For example, the calibration control module 510 may accept the output of an error amplifier 520 as previously described with reference to FIG. 5, and store the output in memory for subsequent processing to determine an optimum corresponding value of b[0:X].

At block 618, it is determined whether a maximum value of b[0:X] (e.g., b[0:X]=$2^{X+1}$−1 in the binary-weighted exemplary embodiment previously described) is reached. If yes, the method proceeds to the operation block 620. If no, the method proceeds to block 619.

At block 619, the value of b[0:X] is incremented. In an exemplary embodiment, incrementing b[0:X] increases the effective W/L of variable-size transistors 421 and 422 in the tuning module 420 by a minimum step size.

It will be appreciated that blocks 618 and 619 may be repeated multiple times, thereby sweeping the control voltages b[0:X] over their entire range from a minimum to a maximum to determine corresponding values of |Vout−V1|.

At block 622 of operation block 620, an optimum value b[0:X]* of the control voltages b[0:X] is applied. In the exemplary embodiment shown, the optimum value b[0:X]* may be the control voltages correspond to the minimum measured value of |Vout−V1|.

At block 624, the calibration control signal 401c is set to 0. It will be appreciated that this selects the input voltage V0 to unit buffer 310A to be the input voltage Vin during normal operation.

Note the sequencing of the operation block 620 after the calibration block 610 in FIG. 6 is not meant to limit the blocks to the particular order shown, and it will be appreciated that calibration block 610 and operation block 620 may be continuously alternated with each other as necessary to maintain adequate output impedance matching of the buffer 410 to the load 120.

Figure 7:
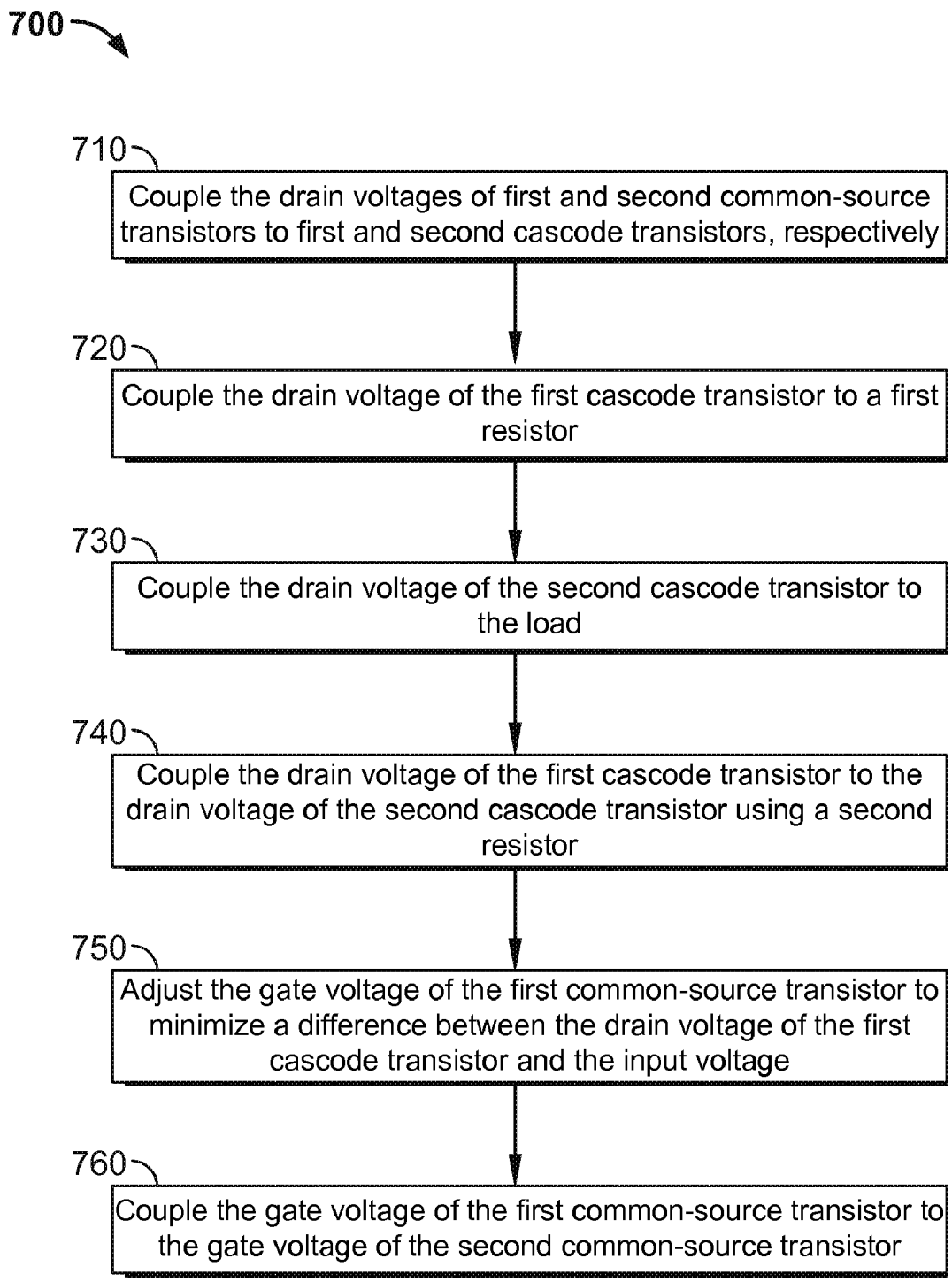
FIG. 7 illustrates an exemplary embodiment of a method for driving a load using an input voltage according to the present disclosure.

FIG. 7 illustrates an exemplary embodiment 700 of a method for driving a load using an input voltage according to the present disclosure.

In FIG. 7, at block 710, the drain voltages of first and second common-source transistors are coupled to first and second cascode transistors, respectively.

At block 720, the drain voltage of the first cascode transistor is coupled to a first resistor.

At block 730, the drain voltage of the second cascode transistor is coupled to the load. In an exemplary embodiment, the first resistor has a nominal resistance n times larger than the nominal resistance of the load.

At block 740, the drain voltage of the first cascode transistor is coupled to the drain voltage of the second cascode transistor using a second resistor. In an exemplary embodiment, the second resistor has a nominal resistance (n+1) times the nominal resistance of the load.

At block 750, the gate voltage of the first common-source transistor is adjusted to minimize a difference between the drain voltage of the first cascode transistor and the input voltage.

At block 760, the gate voltage of the first common-source transistor is coupled to the gate voltage of the second common-source transistor.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:

1. A method for driving a load using an input voltage, the method comprising:

coupling the drain voltages of first and second common-source transistors to first and second cascode transistors, respectively;

coupling the drain voltage of the first cascode transistor to a first resistor;

coupling the drain voltage of the second cascode transistor to the load, the first resistor having a nominal resistance n times larger than the nominal resistance of the load;

coupling the drain voltage of the first cascode transistor to the drain voltage of the second cascode transistor using a second resistor, the second resistor having a nominal resistance (n+1) times the nominal resistance of the load and coupling the first resistor in parallel with the load;

adjusting the gate voltage of the first common-source transistor to minimize a difference between the drain voltage of the first cascode transistor and the input voltage, the gate voltage of the first common-source transistor at least partially dependent on the drain voltage of the first cascode transistor; and coupling the gate voltage of the first common-source transistor to the gate voltage of the second common-source transistor.

2. The method of claim 1, the second common-source transistor having a width-to-length ratio (W/L) n times larger than the first common-source transistor, the second cascode transistor having a width-to-length ratio (W/L) n times larger than the first cascode transistor.

3. The method of claim 1, the adjusting the gate voltage of the first common-source transistor comprising:
coupling the drain voltage of the first cascode transistor to the positive input terminal of a first high gain amplifier;
coupling the input voltage to the negative input terminal of the first high gain amplifier; and
coupling the output current of the first high gain amplifier to the gate of the first common-source transistor.

4. The method of claim 3, the first high gain amplifier comprising a first operational transconductance amplifier (OTA).

5. The method of claim 1, further comprising:
adjusting the gate voltage of the first cascode transistor to minimize the difference between the drain voltages of the first and second common-source transistors.

6. The method of claim 5, the adjusting the gate voltage of the first cascode transistor comprising:
coupling the drain voltage of the first common-source transistor to the negative input terminal of a second operational transconductance amplifier (OTA);
coupling the drain voltage of the second common-source transistor to the positive input terminal of the second OTA; and
coupling the output current of the second OTA to the gate of the first cascode transistor.

7. The method of claim 1, further comprising, during a calibration phase:
adjusting the gate voltage of the first common-source transistor to minimize a difference between the drain voltage of the first cascode transistor and a DC tuning voltage;
discretely increasing the W/L of a variable-size common-source transistor and a variable-size cascode transistor relative to the W/L of the first common-source transistor and the first cascode transistor, respectively, over a range from a minimum W/L to a maximum W/L, the variable-size common-source transistor and the variable-size cascode transistor coupled to the load in parallel with the second common-source transistor and the second cascode transistor; and monitoring a difference between the drain voltages of the first and second cascode transistors for each discrete W/L of the variable-size common-source transistor and the variable-size cascode transistor; the method further comprising:
setting the W/L of the variable-size common-source transistor and the variable-size cascode transistor corresponding to the minimum difference between the drain voltages of the first and second cascode transistors.

8. The method of claim 7, the variable-size common-source transistor and the variable-size cascode transistor each comprising a plurality of branch transistors, the discretely increasing comprising:
selectively coupling the gate voltage of the first common-source transistor to at least a portion of the plurality of branch transistors corresponding to the variable-size common-source transistor.

9. The method of claim 8, the plurality of branch transistors comprising transistors having binary-weighted W/L.

10. The method of claim 8, the plurality of branch transistors comprising transistors of unit W/L.

11. An apparatus comprising:
first and second common-source transistors;
first and second cascode transistors coupled to the first and second common-source transistors, respectively;
a first resistor coupled to the drain of the first cascode transistor, the first resistor having a nominal resistance n times larger than the nominal resistance of a load;
a second resistor coupling the drain of the first cascode transistor to the drain of the second cascode transistor, the second resistor having a nominal resistance (n+1) times the nominal resistance of the load and coupling the first resistor in parallel with the load; and
a first high gain amplifier comprising positive and negative input terminals and an output terminal, an input voltage coupled to the negative input terminal, the drain voltage of the first cascode transistor coupled to the positive input terminal independent of the second cascode transistor and the first and second common-source transistors, the output terminal coupled to the gate voltages of the first and second common-source transistors.

12. The apparatus of claim 11, the second common-source transistor having a width-to-length ratio (W/L) n times larger than the first common-source transistor, the second cascode transistor having a width-to-length ratio (W/L) n times larger than the first cascode transistor.

13. The apparatus of claim 11, the first high gain amplifier comprising a first operational transconductance amplifier (OTA).

14. The apparatus of claim 11, further comprising:
a second high gain amplifier comprising positive and negative input terminals and an output terminal, the drain voltages of the first and second common source transistors coupled to the negative and positive input terminals, respectively, of the second high gain amplifier, the gate voltage of the first cascode transistor coupled to the output terminal of the second high gain amplifier.

15. The apparatus of claim 14, the second high gain amplifier comprising a second operational transconductance amplifier (OTA).

16. The apparatus of claim 11, further comprising a tuning module comprising:
a multiplexer coupled to the negative input terminal of the first high gain amplifier, the multiplexer configured to select between a DC tuning voltage and the input voltage; and a variable-size common-source transistor coupled to a variable-size cascode transistor, the variable-size common-source transistor and the variable-size cascode transistor coupled to the drain of the second cascode transistor; the apparatus further comprising:
a calibration control module; and
an error amplifier comprising positive and negative input terminals and an output terminal, the drain voltage of the first cascode transistor and the drain voltage of the second cascode transistor coupled to the input terminals of the error amplifier, the output terminal of the error amplifier coupled to the calibration control module, the calibration module configured to generate a control signal for the multiplexer and at least one control signal to control the size of the variable-size common-source transistor and the variable-size cascode transistor.

17. The apparatus of claim 16, the calibration control module configured to, during a calibration phase:
control the multiplexer to select the DC tuning voltage;
discretely increase the W/L of the variable-size common-source transistor and the variable-size cascode transistor relative to the W/L of the first common-source transistor and the first cascode transistor, respectively, over a range from a minimum W/L to a maximum W/L; and
monitor the output of the error amplifier; the calibration control module further configured to set the W/L of the variable-size common-source transistor and the variable-size cascode transistor corresponding to the minimum difference between the drain voltages of the first and second cascode transistors.

18. The apparatus of claim 16, the variable-size common-source transistor and the variable-size cascode transistor each comprising a plurality of branch transistors, the at least one control signal generated by the calibration control module configured to selectively couple the gate voltage of the first common-source transistor to at least a portion of the plurality of branch transistors corresponding to the variable-size common-source transistor.

19. The apparatus of claim 18, the plurality of branch transistors comprising transistors having binary-weighted W/L.

20. The apparatus of claim 18, the plurality of branch transistors comprising transistors of unit W/L.

21. An apparatus, comprising:
means for driving a load using an input voltage, the means comprising first and second cascode transistors coupled to first and second common-source transistors; and
means for comparing a drain voltage of the first common-source transistor to a drain voltage of the second common-source transistor and conveying an amplified error voltage to a gate of one of the first and second cascode transistor.

22. The apparatus of claim 21, further comprising means for varying the effective width-over-length ratio (W/L) of the second common-source transistor and the second cascode transistor.

23. The apparatus of claim 21, further comprising means for calibrating the output impedance of the means for driving a load.

* * * * *